United States Patent
Suzuki et al.

(10) Patent No.: US 6,601,963 B2
(45) Date of Patent: *Aug. 5, 2003

(54) FPC FOR MOUNTING COMPONENTS AND SPREAD ILLUMINATING APPARATUS USING THE SAME

(75) Inventors: Shingo Suzuki, Iwata-gun (JP); Koichi Toyoda, Iwata-gun (JP)

(73) Assignee: Minebea Co., Ltd., Kitasaku-gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/784,098

(22) Filed: Feb. 16, 2001

(65) Prior Publication Data
US 2001/0015891 A1 Aug. 23, 2001

(30) Foreign Application Priority Data
Feb. 18, 2000 (JP) ........................................ 2000-041821

(51) Int. Cl.⁷ ................................................. F21V 7/04
(52) U.S. Cl. ........................... 362/31; 362/26; 362/800; 362/330
(58) Field of Search ............................ 362/31, 26, 330, 362/800; 361/715, 749, 750; 331/330, 320

(56) References Cited
U.S. PATENT DOCUMENTS
639,039 A * 12/1899 Suzuki et al. ............... 139/294
6,390,639 B2 * 5/2002 Suzuki et al. ................. 362/31

FOREIGN PATENT DOCUMENTS
JP 10-182076 A 7/1998
JP 11-375192 6/2000

OTHER PUBLICATIONS
U.S. patent application Ser. No. 09/736,424, Suzuki et al., filed Dec. 15, 2000.

\* cited by examiner

*Primary Examiner*—Sandra O'Shea
*Assistant Examiner*—Mark Tsidulko
(74) *Attorney, Agent, or Firm*—Oliff & Berridge, PLC (57) ABSTRACT

There is provided an FPC for mounting components with an improved workability of fitting into other components. Both a second bend (23) and a third bend (25) are provided with a copper foil(s) (15). The copper foil (15) provided at each bend functions as a core material to be plastically transformed when the respective bends (23, 25) are formed and to prevent an FPC (9) from rebounding due to elastic recovery, thereby enabling the bends to retain their shape as desired. As shown in the figure, in case there are a plurality of bends, the copper foil (15) extends to be disposed at all the bends, thereby avoiding the deterioration in workability of assembly, which is invited due to the FPC (9) rebounding. Further, after assembling the FPC (9), a cover portion (20) does not rebound with time within the other components and does not shift off a predetermined position.

11 Claims, 5 Drawing Sheets

FPC FOR MOUNTING COMPONENTS AND SPREAD ILLUMINATING APPARATUS USING THE SAME

BACKGROUND OF THE INVENTION

1. Field of the Invention

The present invention relates to a Flexible Printed Circuit for mounting components (hereinafter referred to as FPC) with an improved workability of fitting into other components, and to a spread illuminating apparatus using the FPC.

2. Description of the Related Art

Recent electric products have been provided with a function to display various information, so that it has become indispensable for those products to have a display portion to display the information. In case of portable electronic products such as portable telephones and notebook computers, in which all components are desired to be reduced in dimension and weight, a liquid crystal display device (the ratio of the thickness to the display area is extremely small), which occupies a small volume in the product and is lightweight, is generally used for the display portion. However, since the liquid crystal display device does not emit light by itself, it will be necessary to provide a separate illuminating apparatus besides the liquid crystal display device when used in dark places or at night. Based on the above demand, a spread illuminating apparatus described hereinafter is designed to achieve a uniform illumination over the entire display portion.

The spread illuminating apparatus illuminates entirely the liquid crystal display device in such a way that when the transparent substrate is illuminated at its end surface, light rays are directed into a transparent substrate made of a light-transmissible material and provided on the front or back surface of the liquid crystal display device and are uniformly supplied from the surface of the transparent substrate toward the display portion of the liquid crystal display device.

A fluorescent tube (cold cathode fluorescent tube or hot cathode fluorescent tube) has been conventionally used as a light source for illuminating the end surface of the transparent substrate. However, since the fluorescent tube requires a high voltage to emit light, a means for supplying a high voltage is necessary. This conflicts with the miniaturization required for the components of portable products.

In order to solve the above problems, the inventors of the present invention have developed a spread illuminating apparatus using a spot-like light source such as light emitting diodes, and disclosed in detail in the Japanese Patent Application No. Hei 10-182076. This spread illuminating apparatus using a light emitting diode as a light source is briefly explained below with reference to FIGS. 5 to 8.

Figure 5:
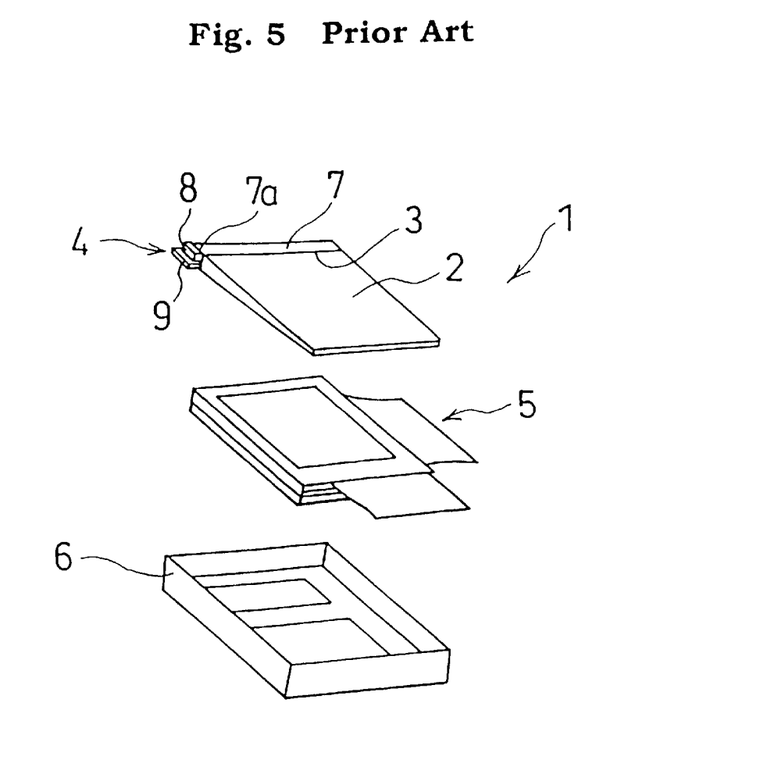
FIG. 5 is an exploded perspective view showing an example of a conventional spread illuminating apparatus.
Figure 6:
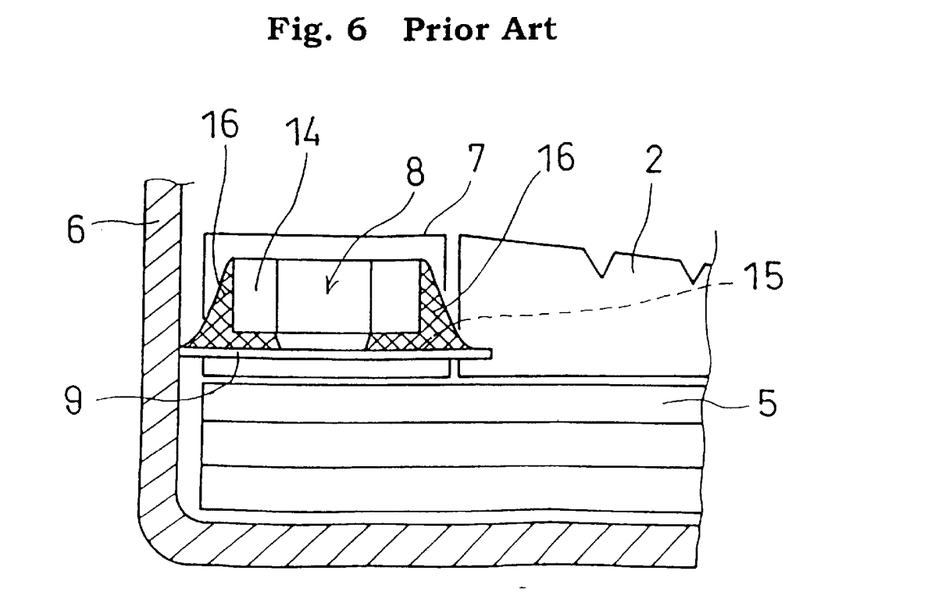
FIG. 6 is a sectional view schematically showing how a spot-like light source and others are disposed with respect to an FPC in FIG. 5.
Figure 7:
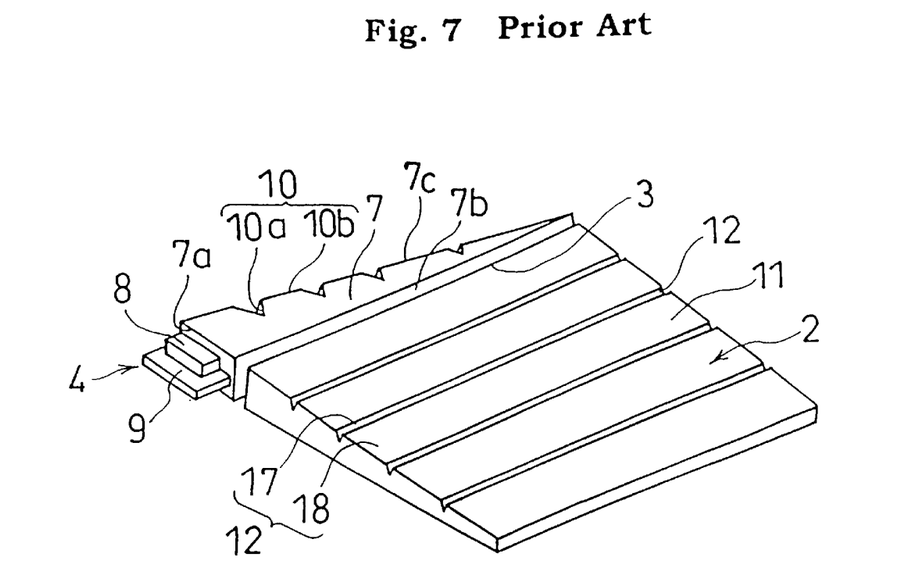
FIG. 7 is a perspective view showing the spread illuminating apparatus in FIG. 5.

In FIGS. 5 to 7, this spread illuminating apparatus 1 is generally composed of a transparent substrate 2 made of a light-transmissible material, and a bar-like light source 4 disposed close to an end surface 3 of the transparent substrate 2. A liquid crystal panel 5 is provided at the lower surface of the transparent substrate 2 and this spread illuminating apparatus 1 is to be used as a subsidiary illumination for the liquid crystal panel 5. Further, a box-shaped metallic frame 6 is provided so as to cover the spread illuminating apparatus 1 and the liquid crystal panel 5.

The transparent substrate 2 is formed in a wedge-shape, that is, the thickness of the transparent substrate 2 is in inverse proportion to the increase in distance from the end surface 3 and gradually decreases.

The light source 4 is generally composed of a light conductive member 7 (FIG. 7) made of a transmissible material, formed in a triangular long-plate shape and disposed close to and along the end surface 3 of the transparent substrate 2, and a spot-like light source 8 disposed facing one end 7a of the light conductive member 7 and mounted on an FPC 9.

A surface 7c (second surface of light conductive member) of the light conductive member 7 opposing a surface 7b (first surface of light conductive member) facing the transparent substrate 2 is slanted with respect to the first surface 7b of the light conductive member in a plan view. The second surface 7c of the light conductive member is provided with an optical path conversion means 10 which is composed of grooves 10a substantially triangular in section and flat portions 10b each formed between two adjacent grooves 10a. Therefore, light rays which enter the one end 7a of the light conductive member 7 can be uniformly emitted at the first surface 7b of the light conductive member despite the spot-like light source 8 being disposed at the one end 7a.

A light reflection pattern 12 is formed on a surface 11 of the transparent substrate 2 (the upper side in FIG. 7, hereinafter referred to as upper surface). Thus, the brightness is almost uniform everywhere on the transparent substrate 2 irrespective of the distance from the light conductive member 7.

A light emitting diode prepared as a chip component and functioning as the spot-like light source 8 is mounted on the FPC 9, and a terminal 14 thereof is connected to a copper foil 15 (conductive member) by soldering. A solder fillet 16 is shown with hatching in FIG. 6.

Figure 8:
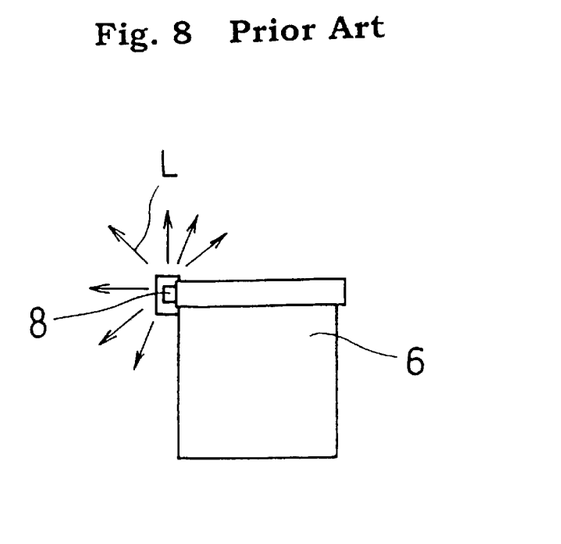
FIG. 8 is a view schematically showing how light rays leak in the spread illuminating apparatus in FIG. 5.
Figure 9:
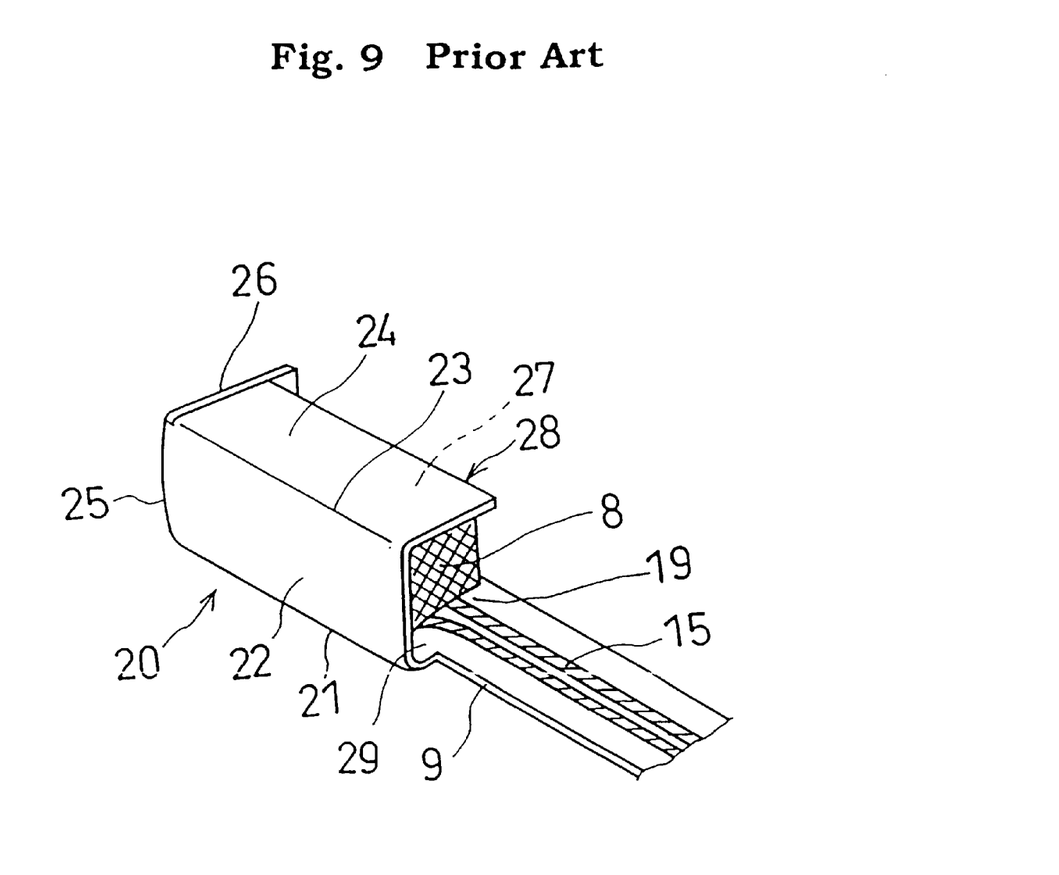
FIG. 9 is a perspective view showing the FPC and a cover portion in FIG.

In the conventional art shown in FIGS. 5 to 7, the terminal 14 and the solder fillet 16 are disposed close to the metallic frame 6, where a short circuit may occur. And, while it is desired for light rays emitted from the spot-like light source 8 to enter the light conductive member 7 efficiently, the spot-like light source 8 is provided in such a manner as to be substantially exposed. As a result, light rays L leak outward from the periphery of the spot-like light source 8 as shown in FIG. 8, decreasing the efficiency of light incidence. The present inventors have disclosed means for solving the above problems in detail in Japanese Patent Application No. Hei 11-375192 or the other related application, and the means are structured as shown in FIG. 9.

The FPC 9 is generally composed of a rectangular portion (substrate) 19 on which the spot-like light source 8 is mounted, and a cover portion 20 extending from the substrate 19 and encasing the spot-like light source 8 for electrically insulating from its periphery. The cover portion 20 has a rectangular face portion (first face portion) 22 which is orthogonal to and continuous with the substrate 19 and bent (this bent portion is referred to as first bend 21) along the wall surface of the spot-like light source 8. A rectangular face portion 24 (second face portion) is formed in such a manner as to be orthogonal to and continuous with the first face portion 22, to be bent (this bent portion is referred to as second bend 23) along the wall surface of the spot-like light source and to be in parallel with the substrate 19. Further, a rectangular face portion (third face portion) 26 is formed in such a manner as to be orthogonal to the bend 23, to extend from the first face portion 22 and to be bent (this bent portion is referred to as third bend 25) along the wall surface of the spot-like light source.

A space 27 defined by the substrate 19, the first, second and third face portions 22, 24 and 26 accommodates the spot-like light source 8 mounted on the substrate 19. The space 27 has non-definition (referred to as first opening 28) at the side opposing the first face portion 22. The spot-like light source 8 and the FPC 9 are disposed in such a manner that this first opening 28 faces the end 7a of the light conductive member 7 so as to make light rays from the spot-like light source 8 enter the light conductive member 7. The portions denoted by reference numeral 15 in FIG. 9 are metallic foil (copper foil) provided on the FPC 9. The copper foil(s) 15 extends from the substrate 19 to the first face portion 22, and the copper foil(s) 15 at the first face portion 22 is connected to the spot-like light source 8.

In the above structure, the cover portion 20 (substrate 19, the first, second and third face portions 22, 24, 26) ensures that the spot-like light source 8 is insulated from the metallic frame 6 while preventing the light rays from leaking outward from the periphery of the spot-like light source 8, thereby solving the above problems. However, the cover portion 20 raises a new problem when the FPC 9 and the spot-like light source 8 are set in the metallic frame 6.

The new problem is that the first bend 21, the second bend 23 and the third bend 25 do not bend as desired and rebound by elastic recovery generated due to the properties of raw materials of the FPC 9 (polyimide, polyester and the like). Because of this inconvenience and the small size as well, the workability of setting the FPC 9 into the metallic frame 6 is remarkably lowered. Moreover, the FPC 9 itself may crack when a strong force is applied to force each bend to retain its shape. Further, even after assembly, the cover portion 20 expands with time within the metallic frame 6 and may shift off a predetermined position. Note that, the above problem is not limited to the specific FPCs used in spread illuminating apparatuses, but it is applicable to all FPCs that are bent along the wall surface of chip components mounted thereon.

SUMMARY OF THE INVENTION

The present invention has been made in the light of the above problems, and the object of the present invention is to prevent each bend from rebounding due to elastic recovery, thereby improving workability of setting an FPC for mounting components into other components. Further, another object of the present invention is to improve the workability of setting in while ensuring insulation of a light emitting diode prepared as a chip component and functioning as spot-like light source and preventing light rays from leaking outward from the periphery of the spot-like light source when the FPC for mounting components is used in a spread illuminating apparatus.

In order to solve the above problems, according to a first aspect of the present invention, there is provided an FPC for mounting components, which is bent along a wall surface of a mounted chip component, characterized in that a core material which can be plastically transformed is provided at a bend. According to the present invention, the core material prevents the bend from rebounding due to the elastic recovery of the FPC for mounting components, thereby enabling the bend to retain its shape as desired.

Further, according to a second aspect of the present invention, in the FPC for mounting components according to the first aspect of the present invention, a plurality of bends are provided and the core material is disposed at all of the bends. According to this structure, a plurality of wall surfaces of the chip components can be covered with the FPC. And, the core material is disposed at each of the bends, which prevents each bend from rebounding, thereby enabling the bend to retain its shape as desired.

According to a third aspect of the present invention, in the FPC for mounting components according to second aspect of the present invention, the core material is a metallic foil constituting an FPC pattern. Therefore, the core material can be formed simultaneously with the pattern for mounting the chip components.

Further, according to a fourth aspect of the present invention, in the FPC for mounting components according to the third aspect of the present invention, the difference in area between the patterns continuous with pads of both electrodes, on which terminals of the chip components are mounted, is reduced as needed. With this structure, the difference in heat capacity between the pads of both electrodes is reduced, and a problem (chip standing) during re-flow soldering can be prevented.

Further, according to a fifth aspect of the present invention, there is provided a spread illuminating apparatus, in which a bar-like light source comprising a light conductive member made of a transmissible material, formed bar-like and disposed close to and along at least one end surface of a transparent substrate and a spot-like light source disposed on at least one end of the light conductive member and mounted on an FPC, is disposed close to the end surface of the transparent substrate made of a light-transmissible material, the spread illuminating apparatus being characterized by employing the FPC for mounting components according to any one of the first to fourth aspects of the present invention.

According to the present invention, the core material provided at the FPC enables the prevention of the rebound of the FPC due to the elastic recovery, and the bend can retain its shape as desired. Thus, the workability of setting the FPC into other components is improved.

DETAILED DESCRIPTION OF THE PREFERRED EMBODIMENTS

The preferred embodiments of the present invention are hereinafter explained referring to the attached figures. The components identical with or corresponding to those in the conventional technique are represented by the same reference numerals and detailed description thereof is omitted.

A spread illuminating apparatus 1A according to a first embodiment of the present invention and an FPC 9 used therein are explained with reference to FIGS. 1 and 2 (note that a conventional substrate 19 explained in FIG. 9 has a substantially same shape as a substrate 19 according to the embodiment of the present invention. Therefore, refer to FIG. 9 in addition to the explanation below).

Figure 1:
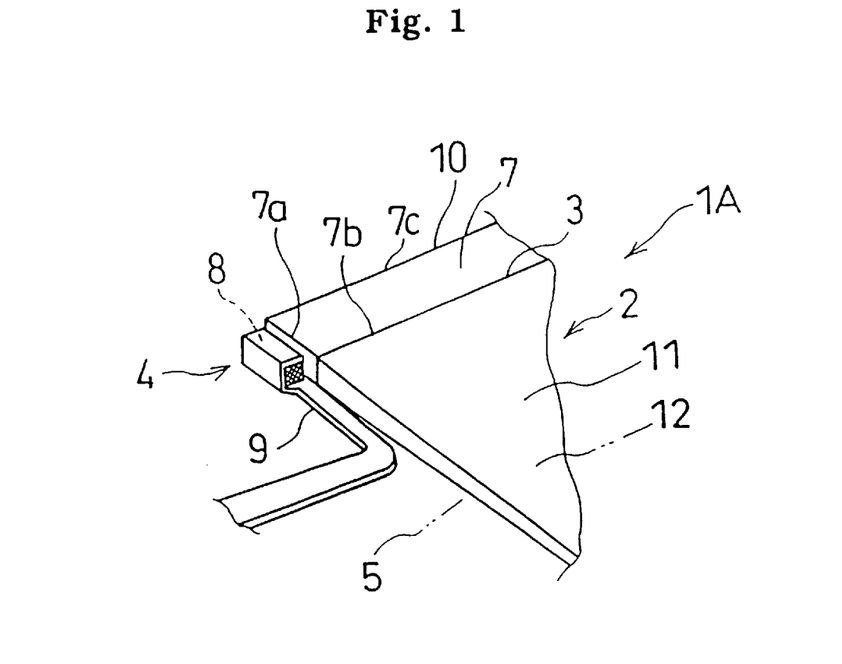
FIG. 1 is a schematic perspective view showing a spread illuminating apparatus according to Embodiment 1 of the present invention.

As shown in FIG. 1, the spread illuminating apparatus 1A according to the embodiment of the present invention is generally composed of a transparent substrate 2 made of a light-transmissible material and a bar-like light source 4 disposed close to one end surface 3 of the transparent substrate 2. This spread illuminating apparatus 1A is used, for example, as a subsidiary illumination for a liquid crystal panel 5 disposed at the lower surface of the transparent substrate 2.

The transparent substrate 2 is formed in a wedge-shape, in which the thickness is in inverse proportion to the increase in distance from the end surface 3 and gradually decreases.

A light reflection pattern 12 (refer to FIG. 7) is formed on a surface of the transparent substrate 2 (the upper side in FIG. 1, hereinafter referred to as upper surface) 11. The light reflection pattern 12 is composed of a number of grooves 17 which have a substantially triangular shape in section, and a number of flat portions 18 each of which is formed between two adjacent grooves 17 (refer to FIG. 7). The light reflection pattern 12 is arranged in such a manner that the ratio of the width (occupied area) of the grooves 17 to the width (occupied area) of the flat portions 18 gradually increases in proportion to the increase in distance from the end surface 3 of the transparent substrate 2 so that the brightness is uniform everywhere on the transparent substrate 2 irrespective of the distance from a light conductive member 7.

The grooves 17 of the light reflection pattern 12 formed on the transparent substrate 2 are so fine that the grooves 17 will not cause any interference with viewing the screen.

The light source 4 is generally composed of the light conductive member 7 made of a transmissible-material, formed bar-like and disposed close to and along the end surface 3 of the transparent substrate 2 and a spot-like light source 8 (light emitting diode) mounted on an FPC 9 and disposed facing one end of the light conductive member 7.

In the light conductive member 7, an optical path conversion means 10 is provided on a surface 7c (second surface of the light conductive member) opposing a surface 7b (first surface of the light conductive member) facing the transparent substrate 2, whereby light rays entering one end 7a of the light conductive member 7 is uniformly emitted at the first surface 7b of the light conductive member despite the spot-like light source 8 being arranged at one end 7a.

The FPC 9 is generally composed of a rectangular portion (substrate) 19 on which the spot-like light source 8 is mounted and a cover portion 20 extending from the substrate 19 and covering the spot-like light source 8 thereby electrically insulating from its periphery.

As described above, the general shape of the cover portion 20 is substantially same as that of the conventional cover portion 20 shown in FIG. 9.

A space 27 defined by the substrate 19, first, second and third face portions 22, 24 and 26 accommodates the spot-like light source 8 mounted on the substrate 19. The space 27 has non-definition (first opening 28) at the side opposing the first face portion 22, and the spot-like light source 8 and the FPC 9 are disposed in such a manner that the first opening 28 faces the end 7a of the light conductive member 7, whereby light rays from the spot-like light source 8 enter the light conductive member 7. Note that, an opening opposing the third face portion 26 of the cover portion 20 is referred to as second opening 29.

Figure 2:
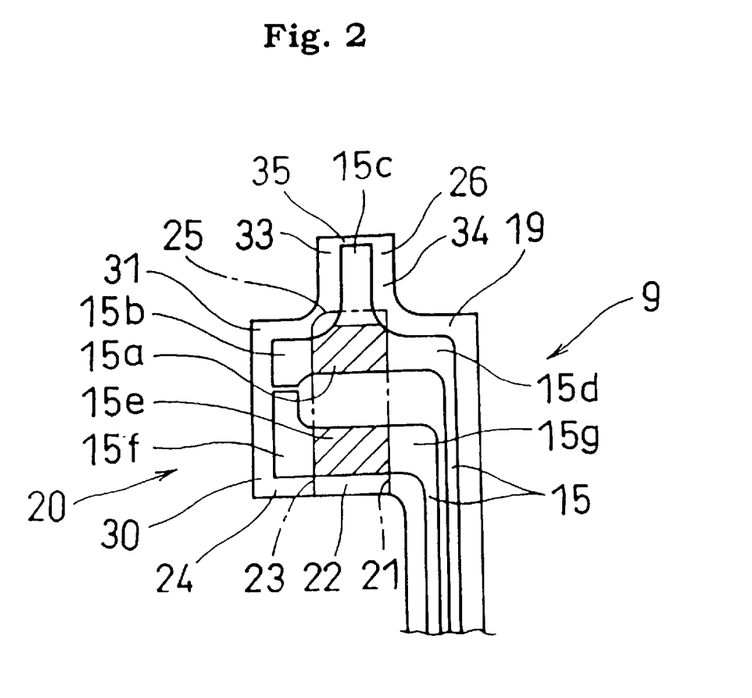
FIG. 2 is a developed view showing a cover portion in FIG. 1 before bending.

Copper foils 15 provided at the FPC 9 are shown in FIG. 2. In this embodiment, the copper foils 15 extend from the substrate 19 to the first face portion 22, and further extend to pass second and third bends 23 and 25 and reach the second and third face portions 24 and 26, respectively. Thus, two copper foils 15 extending up to the second face portion 24 cover the inner surface (toward the space 27) of the cover portion 20 except for side areas 30 and 31, and one copper foil 15 extending up to the third face portion 26 covers the inner surface (toward the space 27) of the cover portion 20 except for side areas 33, 34 and 35.

Note that, pads for mounting the spot-like light source 8 on are formed in such a manner that the copper foils 15 are exposed without an insulating layer such as a cover coating at areas 15a and 15e (hatched in the figure) positioned in the first face portion 22.

Further, for a reason to be described hereinafter, the shapes of the copper foils 15 should be determined so that there should exist preferably no difference between a total area S1 of portions 15a, 15b, 15c and 15d shown in FIG. 2 and a total area S2 of portions 15e, 15f, and 15g shown in FIG. 2.

The effect that can be obtained from the embodiment of the present invention with the above structure is as follows. First, in this embodiment, the copper foil(s) 15 is present both at the second bend 23 and the third bend 25 in the cover portion. The copper foil 15 at the above portions functions as a core material to be plastically transformed when the bends 23 and 25 are formed and prevent the FPC 9 from rebounding due to the elastic recovery, thereby maintaining the shape of the bends as desired. As shown in the figure, all the bends are provided with the copper foil 15 if there are a plurality of bends, thereby enabling the prevention of the deterioration in the workability of setting the cover portion 20 into a metallic frame 6, which incurs due to the rebounding of the FPC. Further, after set in the FPC 9, the cover portion 20 does not rebound with time in the metallic frame 6, eliminating the problem that the cover portion 20 shifts off a predetermined position.

Figure 3:
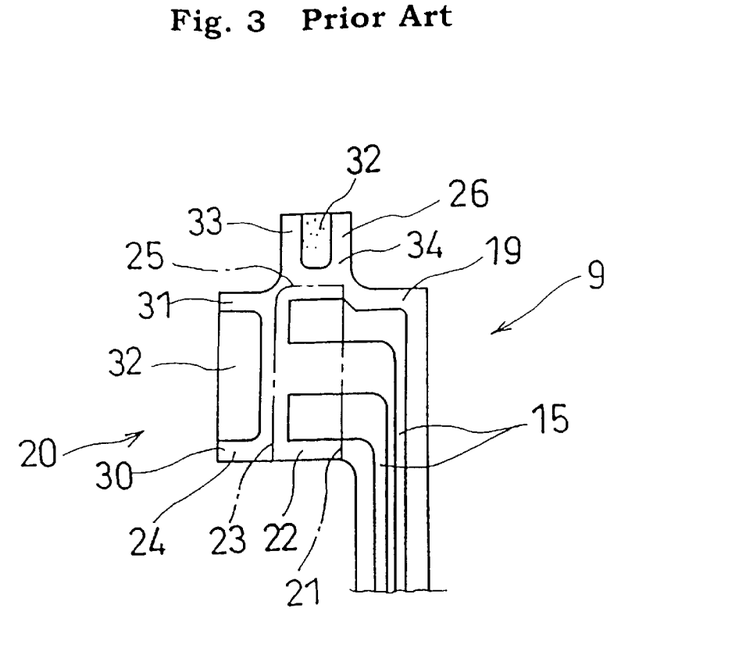
FIG. 3 is a developed view showing a conventional FPC for comparison to FIG. 2.

For reference, the conventional FPC 9 as shown in FIG. 3 is composed in such a manner that the copper foil 15 is not present at the second bend 23 and the third bend 25 in the cover portion. And, a copper foil 32 for blocking light rays, which is separate from and independent of the copper foils 15, is provided at the second face portion 24 and the third face portion 26, respectively. That is, the core for preventing the cover portion 20 from rebounding due to the elastic recovery of the FPC 9 is not present at the second bend 23 and the third bend 25. Thus, the FPC 9 provided with the conventional cover portion 20 will not solve the problem which the present invention is meant to solve.

Further, in the present invention, the copper foils 15 at the substrate 19 extend to the first face portion 22 and further to the second face portion 24, thereby functioning as the core material. Thus, a pattern for mounting a spot-like light source 8 on and the core can be simultaneously formed. Therefore, a cost increase for separately providing portions to function as the core can be eliminated. The present invention is not limited to this embodiment, rather the same effect described above can be obtained by providing a material which can be plastically transformed and block light rays at the second bend 23 and the third bend 25 independently of the copper foils 15.

As described above, the shape of the copper foils 15 should be determined so that the difference between the area S1 and the area S2 is minimized whereby the difference in heat capacity between the pads 15a and 15e of both electrodes can be eliminated, thereby preventing the problem (chip standing) during re-flow soldering. The difference between the area S1 and S2 may be reduced only to such an extent that the present object is reached, and does not have to be completely eliminated.

Moreover, in the cover portion 20 in the embodiment of the present invention, because the copper foil(s) 15 is provided in the second face portion 24 and the third face portion 26, it is possible to ensure the insulation of the spot-like light source 8 from the metallic frame 6 and to prevent light rays from leaking outward from the periphery of the spot-like light source 8.

In addition, workability of setting the FPC 9 in a frame 37 (see FIG. 4), which is disclosed in detail by the present inventors in the Japanese Patent Application No. Hei 11-375192, can be improved by applying the embodiment of the present invention.

Figure 4:
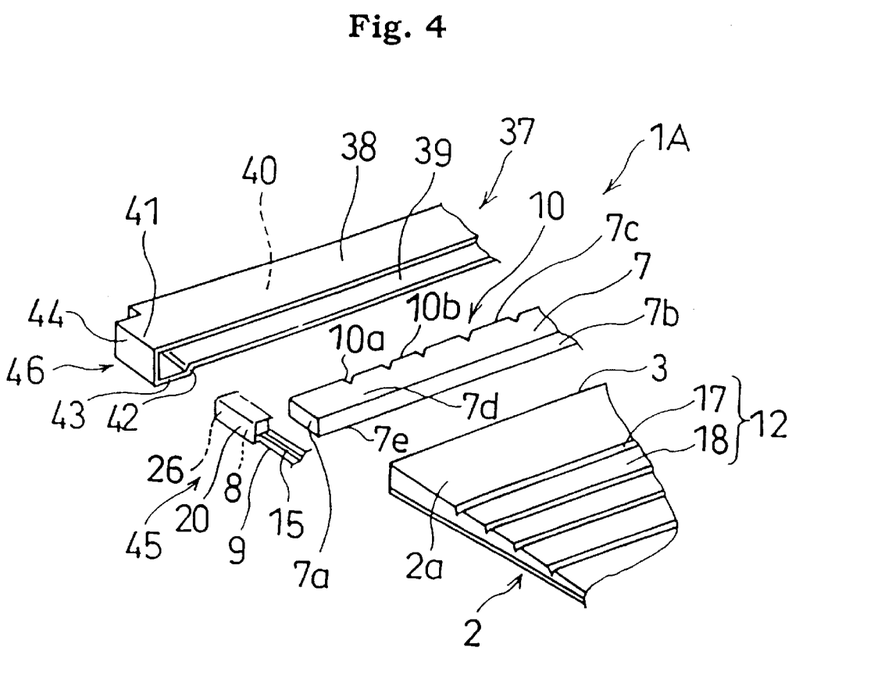
FIG. 4 is an exploded perspective view of a spread illuminating apparatus having a frame with a different structure to which the embodiment of the present invention is applicable.

The frame 37 is made of metal, covers the longitudinal surfaces of a light conductive member 7 except a first surface 7b of the light conductive member [covered are a second surface 7c opposing the first surface 7b and two surfaces (third surface 7d and fourth surface 7e) orthogonal to and continuous with the first and second surfaces 7b, 7c] and extends up to a portion 2a toward an end surface 3 of a transparent substrate 2 (hereinafter referred to as transparent substrate proximal portion).

The frame 37 is generally composed of opposing plates that face the third and fourth surfaces 7d and 7e of the light conductive member 7, respectively (the opposing plate that faces the third surface 7d is referred to as first opposing plate 38, and the opposing plate that faces the fourth surface 7e is referred to as second opposing plate 39), and a frame 40 which is substantially orthogonal to and continuous with the first and second opposing plates 38 and 39. The distance from the first opposing plate 38 to the second opposing plate 39 is set a little larger than the height of the third face portion 26 of the cover portion 20.

The first opposing plate 38 extends (referred to as first extension 41) to one end of the frame 37, and the second opposing plate 39 extends (referred to as second extension 43) to the end of the frame 37 via a step 42. The tip ends of the first and second extension 41 and 43 are continuous with an end plate 44. The first and second extensions 41, 43 and the end plate 44 are structured to house a portion (where the spot-like light source is disposed) 45 including the substrate 19 in the FPC 9 and the cover portion 20, thereby constituting a spot-like light source housing portion 46.

Since the frame 37 has a small space for inserting the cover portion 20 to cover the FPC 9, the deterioration in workability due to the rebound of the FPC 9 comes out strikingly. Therefore, the effect resulting from applying the embodiment of the present invention will be even more meaningful. Note that, the FPC of the present invention is used for a spread illuminating apparatus as an application example in the embodiment of the present invention, but the present invention is not limited to this and may be applied to all FPCs bent along the wall surfaces of the chip components which are mounted.

The present invention thus constructed has the following effects. First, according to the first aspect of the present invention, the FPC for mounting components of the present invention is prevented from rebounding due to elastic recovery, whereby the workability of setting the FPC for mounting components into other components can be improved.

Further, according to the second aspect of the present invention, the FPC for mounting components of the present invention, in case there are a plurality of bends, prevents each of the bends from rebounding, whereby the bends can retain their shape as desired.

According to the third aspect of the present invention, the FPC for mounting components enables the core to be formed simultaneously with the pattern for mounting the chip components, resulting in holding down a cost increase.

Moreover, according to the fourth aspect of the present invention, the FPC for mounting components of the present invention can eliminate the problem of chip standing during re-flow soldering.

According to the fifth aspect of the present invention, in the spread illuminating apparatus employing the FPC for mounting components of the present invention, the workability of assembly can be improved while ensuring the insulation of the spot-like light source and preventing light rays from leaking outward from the periphery of the spot-like light source.

What is claimed is:

1. An FPC for mounting components, which is bent along a wall surface of a mounted chip component, characterized in that a core material which can be plastically transformed is disposed at a plurality of bends to prevent rebounding of bends due to elastic recovery.

2. The FPC for mounting components as claimed in claim 1, wherein said core material is disposed at all bends.

3. The FPC for mounting components as claimed in claim 1, wherein said core material is a metallic foil constituting an FPC pattern.

4. The FPC for mounting components as claimed in claim 1, wherein a difference in area between patterns continuous with pads of both electrodes, on which a terminal of said chip component is mounted, is reduced.

5. A spread illuminating apparatus, in which a bar-like light source comprising a light conductive member made of a transmissible material, formed bar-like and disposed close to and along at least one end surface of a transparent substrate and a spot-like light source disposed on at least one end of said light conductive member and mounted on an FPC, is disposed close to an end surface of said transparent substrate made of a light-transmissible material, characterized by employing the FPC for mounting components as claimed in claim 1.

6. The FPC for mounting components as claimed in claim 2, wherein said core material is a metallic foil constituting an FPC pattern.

7. The FPC for mounting components as claimed in claim 2, wherein a difference in area between patterns continuous with pads of both electrodes, on which a terminal of said chip component is mounted, is reduced.

8. The FPC for mounting components as claimed in claim 3, wherein a difference in area between patterns continuous with pads of both electrodes, on which a terminal of said chip component is mounted, is reduced.

9. A spread illuminating apparatus, in which a bar-like light source comprising a light conductive member made of a transmissible material, formed bar-like and disposed close to and along at least one end surface of a transparent substrate and a spot-like light source disposed on at least one end of said light conductive member and mounted on an FPC, is disposed close to an end surface of said transparent substrate made of a light-transmissible material, characterized by employing the FPC for mounting components as claimed in claim 2.

10. A spread illuminating apparatus, in which a bar-like light source comprising a light conductive member made of a transmissible material, formed bar-like and disposed close to and along at least one end surface of a transparent substrate and a spot-like light source disposed on at least one end of said light conductive member and mounted on an FPC, is disposed close to an end surface of said transparent substrate made of a light-transmissible material, characterized by employing the FPC for mounting components as claimed in claim 3.

11. A spread illuminating apparatus, in which a bar-like light source comprising a light conductive member made of a transmissible material, formed bar-like and disposed close to and along at least one end surface of a transparent substrate and a spot-like light source disposed on at least one end of said light conductive member and mounted on an FPC, is disposed close to an end surface of said transparent substrate made of a light-transmissible material, characterized by employing the FPC for mounting components as claimed in claim 4.

* * * * *